United States Patent [19]

Yamaguchi

[11] Patent Number: 5,642,315
[45] Date of Patent: Jun. 24, 1997

[54] STATIC TYPE OF SEMICONDUCTOR MEMORY DEVICE HAVING GREAT LOW VOLTAGE OPERATION MARGIN

[75] Inventor: Takashi Yamaguchi, Tokyo, Japan

[73] Assignee: NEC Corporation, Japan

[21] Appl. No.: 535,723

[22] Filed: Sep. 28, 1995

[30] Foreign Application Priority Data

Oct. 12, 1994 [JP] Japan .................................. 6-245738

[51] Int. Cl.⁶ .................................................. G11C 11/413
[52] U.S. Cl. ............... 365/189.09; 365/204; 365/189.11; 365/203; 365/230.06
[58] Field of Search ..................... 365/189.01, 189.09, 365/203, 204, 189.11, 230.06

[56] References Cited

U.S. PATENT DOCUMENTS

| | | | |
|---|---|---|---|
| 5,103,113 | 4/1992 | Inui et al. | 307/270 |
| 5,115,412 | 5/1992 | Tobita | 365/189.09 |
| 5,467,306 | 11/1995 | Kaya et al. | 365/185.2 |
| 5,510,749 | 4/1996 | Arimoto | 327/546 |
| 5,524,095 | 6/1996 | Someya et al. | 365/189.09 |

FOREIGN PATENT DOCUMENTS 5-234363  9/1993  Japan .

OTHER PUBLICATIONS

"A Boost Circuit for Low Supply Voltage" Kozaru et al; Proc. of the 1993 IEICE Spring Conference, C-622; p. 5-252.

*Primary Examiner*—Viet Q. Nguyen
*Attorney, Agent, or Firm*—Hayes, Soloway, Hennessey, Grossman & Hage, P.C.

[57] ABSTRACT

A static type of semiconductor memory device includes a power supply line for supplying a power supply voltage, a pair of bit lines, a word line, and a memory cell connected to the word line and the pair of bit lines. The power supply voltage is boosted up to provide the boosted voltage on a boosted voltage line. A predetermined voltage is supplied to the word line using the boosted voltage and a write operation or read operation is performed to the memory cell via the pair of bit lines when the predetermined voltage is supplied on the word line. The predetermined voltage is approximately equal to a sum of the power supply voltage and a threshold voltage of a MOS transistor, resulting in a great low voltage operation margin.

20 Claims, 11 Drawing Sheets

STATIC TYPE OF SEMICONDUCTOR MEMORY DEVICE HAVING GREAT LOW VOLTAGE OPERATION MARGIN

BACKGROUND OF THE INVENTION

1. Field of the Invention

The present invention relates to a static type of semiconductor memory device, and more particularly, to a static type of semiconductor memory device including a boosting circuit for boosting the voltage of a word line higher than a power supply voltage.

2. Description of Related Art

Recent, semiconductor integrated circuits shift quickly to allow a low voltage operation, for example, 3.3 V operation or 3.0 V operation because of user needs and the increase of reliability of the semiconductor integrated circuits themselves. A static type of semiconductor memory device is not excluded and a manufactures develop such products of the low voltage operation specification.

The technique for boosting the potential of a word line higher than a power supply voltage in the static type of semiconductor memory device is reported by K. Kozuru, M. Ukita, S. Murakami, Y. Morooka, Y. Nishimura, K. Anami in "A Boost Circuit for Low Supply Voltage" (Proc. of the 1993 IEICE Spring Conference, C-622, p. 5–252).

In this technique, as shown in FIG. 1, the static type of semiconductor memory device includes a word line boosting circuit 102 for boosting up the power supply voltage $V_{CC}$ to a voltage $V_{BST}$, a word line driving circuit 103 for driving a word line WL in accordance with an input address to supply the voltage $V_{BST}$ to the word line WL, a pair of bit lines DG1 and DG1* (this means the inverted signal of DG1), and a memory cell circuit 104 connected to the word line WL and the pair of bit lines DG1 and DG1* via transfer gates. The boosting circuit 102 generates the boosted voltage $V_{BST}$ from the power supply it voltage $V_{CC}$ to supply to the word line driving circuit 103. The circuit 103 supplies the boosted voltage $V_{BST}$ on the word line WL in accordance with the input address. The memory cell circuit 104 includes a memory cell and is accessed via the pair of bit lines DG1 and DG1* when the boosted voltage $V_{BST}$ is supplied to the word line W1.

The word line boosting circuit 102 is shown in FIG. 2 in detail. Referring to FIG. 2, the circuit 102 is constituted by an inverter 21 for inputting a signal $\phi_{BST}$, a P-channel MOS transistor Q102 connected between the power supply voltage $V_{CC}$ line and the boosted voltage $V_{BST}$ line and a P-channel MOS transistor Q103 connected to the boosted voltage $V_{BST}$ line, an N-channel MOS transistor Q104 connected between the P-channel MOS transistor Q103 and the ground potential, and a boosting up capacitor $C_{BST}$ between the output of the inverter 121 and the boosted voltage $V_{BST}$ line. Note that a parasitic capacitor $C_{PAR}$ is the capacitor parasitizing the boosted voltage $V_{BST}$ line. The signal $\phi$BST is connected to the node between the gates of the MOS transistors Q103 and Q104 and the gate of the MOS transistor Q102 is connected to the MOS transistors Q103 and Q104. When the signal $\phi_{BST}$ is in the high level, the output of the inverter 121 is the low level so that the capacitor $C_{BST}$ is charged from the power supply voltage $V_{CC}$ via the P-channel MOS transistor Q102. When the signal $\phi_{BST}$ is in the low level, the output of the inverter 121 is the high level, so that the potential of the capacitor $C_{BST}$ is arisen higher than the power supply voltage $V_{CC}$. FIG. 6 shows a relation of the boosted voltage $V_{BST}$, i.e., the word line voltage to the power supply voltage $V_{CC}$. As seen from the figure, the boosted voltage $V_{BST}$ becomes greater as the power supply voltage $V_{CC}$ is increased.

The above-mentioned word line driving circuit 103 is shown in FIG. 3 in detail. Referring to FIG. 3, the driving circuit 103 is constituted of a NAND circuit 131 for inputting an address signal and a word line activation signal $\phi_{WL}$, an N-channel MOS transistor Q105 connected to the output of the NAND circuit 131 and having the gate always supplied with the power supply voltage $V_{CC}$, a P-channel MOS transistor Q106 connected between the boosted voltage $V_{BST}$ line and the MOS transistor Q105 on the opposite side of the NAND circuit 131 and a P-channel MOS transistor Q107 connected to the boosted voltage $V_{BST}$ line and the word line WL, and an N-channel MOS transistor Q108 connected between the word line WL and the ground potential GND. The gate of the MOS transistor Q106 is connected to the word line WL and the gates of the transistors Q107 and Q108 are connected to the transistor Q105 together with the transistor Q106. When the word line WL is selected in accordance with the address signal and the activation signal $\phi_{WL}$, i.e., when the output of the NAND circuit 131 is the low level, the N-channel MOS transistor Q108 is turned off so that the boosted voltage $V_{BST}$ is supplied to the word line WL through the P-channel MOS transistor Q107. On the other hand, when the word line WL is not selected, i.e., when the output of the NAND circuit 131 is the high level, the N-channel MOS transistor Q108 is turned on and the P-channel MOS transistor Q106 is also turned on. Therefore, the P-channel MOS transistor Q107 is turned off so that the word line WL is in the ground or low level.

FIG. 4 is a diagram showing an equivalent circuit of a typical memory cell circuit for storing memory information in the static type of semiconductor memory device. In the figure, a load resistor R101 is connected to the drain of an N-channel MOS transistor Q110 and the gate of an N-channel MOS transistor Q112, and a load resistor R102 is connected to the drain of the N-channel MOS transistor Q112 and the gate of the N-channel MOS transistor Q110. The sources of the N-channel MOS transistors Q110 and Q112 are connected to the ground potential. As a result, a flip-flop circuit is constituted. The node N1 between the load resistor R101 and the drain of the N-channel MOS transistor Q110 and the node between the load resistor R102 and the drain of the N-channel MOS transistor Q112 are connected to the bit lines DG1 and DG1* through the N-channel MOS transistors Q109 and Q111 as transfer gates, respectively. The gates of the N-channel MOS transistors Q109 and Q111 are connected to the word line WL. By arranging as described above, data of "1" or "0" can be arbitrarily stored at the nodes N1 and N2. In this case, the write operation or read operation to or from the nodes N1 and N2 are performed by setting the word line WL in a high level and selecting the bit lines DG1 and DG1*.

Whether or not the low voltage operation is allowed in the write operation in the static type of semiconductor memory device is determined based on a low voltage operation margin. For instance, in a case where data of "1" is written in the memory cell shown in FIG. 4, the power supply voltage $V_{CC}$ is applied to the word line WL and the bit line DG1 and a ground voltage GND is applied to the bit line DG1*, if the boosting circuit 102 is not present. In this case, the potential of the node N1 changes to a level of $(V_{CC}-V_{TN})$ immediately after the voltage is applied, where $V_{TN}$ is a threshold voltage of the N-channel MOS transistor Q109 or Q111 as the transfer gate. When a sufficiently long time (of an order of ms to sec.) elapses after the write operation, the potential of the node N1 reaches the $V_{CC}$ level by the load resistor R101 in the memory cell. In the normal operation (shorter than 10 nS), however, the potential is kept to be in the level of about ($V_{CC}-V_{TN}$). Therefore, in the low voltage operation, i.e., when the power supply voltage is low, the low voltage operation is further difficult, because the influence of the threshold voltage $V_{TN}$ to the write level becomes greater in relation to the power supply voltage $V_{CC}$. Therefore, by employing the word line boosting circuit 102 as in the conventional static type of semiconductor memory device shown in FIG. 1, the voltage of word line WL can be boosted higher than the power supply voltage $V_{CC}$, so that the large low voltage operation margin is allowed. As a result, the potential of the storage node N1 immediately after the write operation can be increased.

The operation of the conventional static type of semiconductor memory device including the word line boosting circuit 2 will be described below with reference to FIG. 5. FIG. 5 shows the operation waveforms in the conventional static type of semiconductor memory device. Referring to FIG. 5, first, at time 0, since the signal $\phi_{BST}$ is in the $V_{CC}$ level, the P-channel MOS transistor Q103 of the word line boosting circuit 102 is in the off state, and the P-channel MOS transistor Q102 and the N-channel MOS transistor Q104 are in the on state. Accordingly, the boosted power supply voltage $V_{BST}$ is charged up to the $V_{CC}$ level. Next, at time t1, the signal $\phi_{BST}$ starts to be inverted from the $V_{CC}$ level to the ground (GND) level. In response to the signal $\phi_{BST}$, the P-channel MOS transistor Q103 gradually changes to the on state and the P-channel MOS transistor Q102 and the N-channel MOS transistor Q104 gradually change to the off state. At the same time, the output of the inverter 121 starts to rise from the GND level toward the $V_{CC}$ level. That is, the potential of the boost up capacitor $C_{BST}$ starts to rise upwardly from the $V_{CC}$ level. Accordingly, the boosting up effect appears at the time t2. The boosting up operation is performed until the boosted voltage reaches the voltage of ($V_{CC}+V\alpha$) at the time t3. Note that $V\alpha$ varies based on a ratio of boost up capacitor $C_{BST}$ and parasitic capacitor $C_{PAR}$. If $C_{BST} \gg C_{PAR}$, is approximately equal to the power supply voltage $V_{CC}$.

Next, a word line activation signal $\phi_{WL}$ changes from the GND level to the $V_{CC}$ level at the time t4. In response to the change of the signal $\phi_{WL}$, the P-channel transistor Q107 of the word line driving circuit 103 goes to the on state and the P-channel MOS transistor Q106 and the N-channel MOS transistor Q108 goes to the off state. The voltage of the word line WL rises from the time t5 and reaches the voltage of ($V_{CC}+V\alpha$) at the time t6.

As described above, in the conventional static type of semiconductor memory device, if the ratio of the boost up capacitor $C_{BST}$ and the parasitic capacitor $C_{PAR}$ is set out of a target range because of the variation of the manufacturing process, the boosted voltages $V_{BST}$ of the word lines also arises. Therefore, it is difficult to adjust the boosted voltage $V_{BST}$ of the word line to a predetermined target voltage. If the ratio of the boost up capacitor $C_{BST}$ to the parasitic capacitor $C_{PAR}$ is changed because of variation of the manufacturing process, there would be cases wherein the word line is boosted higher or lower than the predetermined voltage. In the case where the boosted voltage of the word line WL is lower than the target voltage, the voltage of storage node is lower than the power supply voltage $V_{CC}$ immediately after the write operation, so that the low voltage operation margin is decreased. On the other hand, in the case where the boosted voltage of the word line WL is higher than the target voltage, the voltage of storage node is approximately equal to the power supply voltage $V_{CC}$ immediately after the write operation. However, the low voltage operation margin would be decreased. For this reason, the manufacturing process must be determined with a great margin.

Further, even if the boosted voltage $V_{BST}$ of the word line can be adjusted to the predetermined voltage, it is difficult to apply the semiconductor memory device to a power supply such as battery whose voltage varies, because the boosted voltage $V_{BST}$ of the word line is not constant over the wide range of power supply voltage.

SUMMARY OF THE INVENTION

Therefore, an object of the present invention is to eliminate the above problems and to provide a static type of semiconductor memory device in which the boosted voltage of the word line can be adjusted to a predetermined voltage, e.g., a voltage of about ($V_{CC}+V_{TN}$) in the wide range of power supply voltage and a method for regulating the boosted voltage, thereby to provide a great low voltage operation margin.

In order to achieve an aspect of the present invention, a static type of semiconductor memory device includes a power supply line for supplying a power supply voltage, a static type of memory cell connected to a word line and a pair of bit lines via transfer gates of MOS transistors, a boosting circuit for boosting up the power supply voltage, a word line driving circuit for driving the word line with the boosted voltage supplied from the boosting circuit, and a voltage control circuit for controlling the boosted voltage to be in the neighborhood of a predetermined voltage.

The voltage control circuit may be provided between the boosting circuit and the power supply line. It is desirable that the predetermined voltage is approximately equal to a sum of the power supply voltage and a threshold voltage of a MOS transistor such as a transfer gate.

The voltage control circuit may be constituted of an N-channel MOS transistor having a gate and drain connected to said boosting circuit and a source connected to said power supply line. Alternatively, the voltage control circuit may be composed of diodes connected in series, an anode of the first diode being connected to said boosting circuit and a cathode of the last diode being connected to said power supply line.

In order to achieve another aspect of the present invention, a method of providing a great low voltage operation margin in a static type of semiconductor memory device includes the steps of:

boosting the power supply voltage to provide the boosted voltage on a boosted voltage line;

supplying a predetermined voltage to the word line using the boosted voltage; and performing a write operation or read operation to the memory cell via the pair of bit lines when the predetermined voltage is supplied on the word line.

The supplying step includes regulating the boosted voltage to the predetermined voltage, and applying the regulated voltage to the word line.

DESCRIPTION OF THE PREFERRED EMBODIMENTS

A static type of semiconductor memory according to the present invention will be described below with reference to the accompanying drawings.

Figure 7:
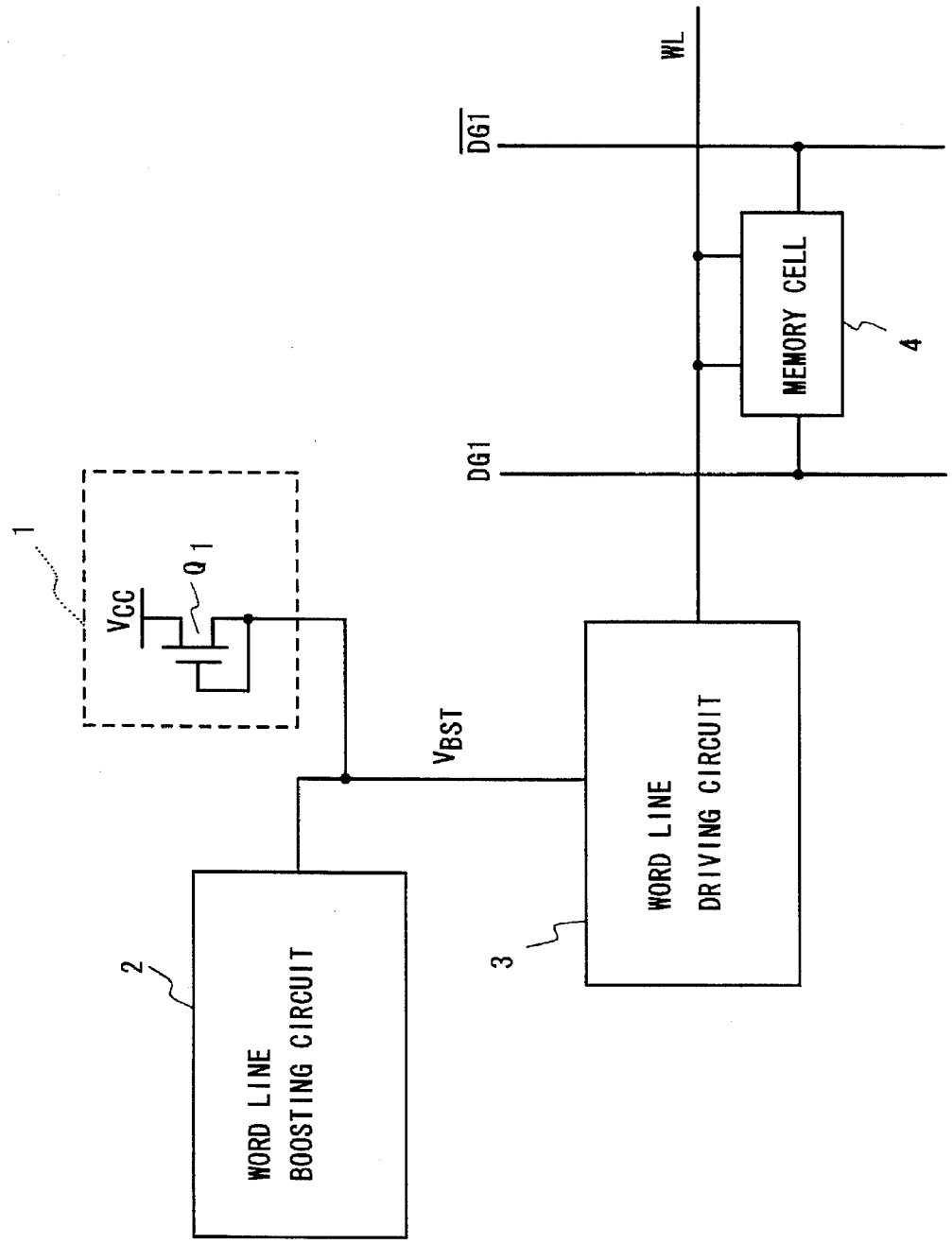
FIG. 7 is a block diagram of a static type of semiconductor memory device according to a first embodiment of the present invention.

FIG. 7 is a block diagram of the static type of semiconductor memory device according to the first embodiment of the present invention. Referring to FIG. 7, the static type of semiconductor memory device includes a word line boosting circuit 2 for boosting up a power supply voltage $V_{CC}$ to a voltage $V_{BST}$ higher than the voltage $V_{CC}$, a word line driving circuit 3 for driving a word line WL to supply the boosted voltage $V_{BST}$ to the word line WL, a suppression circuit 1 connected between the boosted voltage $V_{BST}$ and the power supply voltage $V_{CC}$, for regulating the boosted voltage to a predetermined voltage, i.e., a voltage of $(V_{CC}+V_{TN})$ in the embodiment, and a memory cell circuit 4 connected to the word line WL and a pair of bit lines DG1 and DG1* (the symbol "*" means the inversion). The word line boosting circuit 2, word line boosting circuit 3 and memory cell circuit 4 may have the same structures as those shown in FIGS. 2, 3, 4. The structures are already described in detail and, therefore, the description is omitted here. The suppression circuit 1 is composed of an N-channel MOS transistor Q1 in this embodiment. The MOS transistor Q1 has a gate and drain connected to the boosted voltage $V_{BST}$ and a source connected to the power supply voltage $V_{CC}$. Accordingly, when the boosted voltage $V_{BST}$ supplied from the word line boosting circuit 2 is too higher than the voltage of $(V_{CC}+V_{TN})$, the N-channel MOS transistor Q1 is turned on, so that the boosted voltage $V_{BST}$ is suppressed or regulated to be approximately equal to the voltage $(V_{CC}+V_{TN})$. The voltage $V_{TN}$ is a threshold voltage of the transfer gate Q109 or Q111 in FIG. 4.

Figure 8:
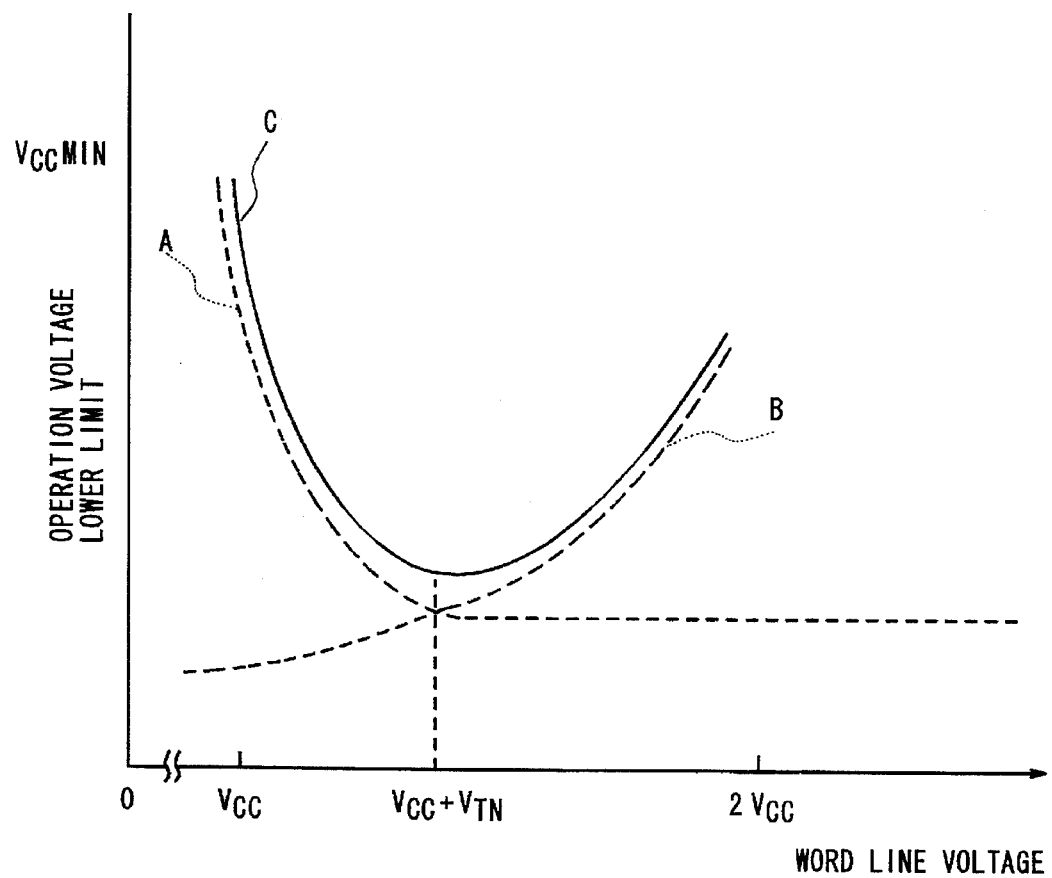
FIG. 8 is a graph showing a relation of the word line voltage and the operation voltage lower limit in a static type of semiconductor memory device when the present invention is not applied.

A relation between the word line voltage and an operation voltage lower limit $V_{CCMIN}$ was simulated. The result is shown in FIG. 8. As shown in FIG. 8 by a dashed line A, as the word line voltage is increased, the operation voltage lower limit is decreased. However, when the word line voltage exceeds the voltage of $(V_{CC}+V_{TN})$, the effect of increase of the word line voltage saturates. On the other hand, a ratio of current flowing through the N-channel MOS transistor Q110 in FIG. 4 to current flowing through the N-channel MOS transistor Q109 is aimed to be 5:1, for example. However, as the word line voltage is increased, the ratio becomes small, as shown in FIG. 8 by a dashed line B. As a result, the operation voltage lower limit has an optimal value at the word line voltage of about $(V_{CC}+V_{TN})$. In other words, at the voltage, the lower voltage operation margin is maximum. That is, the voltage of the word line WL is desirably boosted to the voltage of about $(V_{CC}+V_{TN})$ for the above reasons.

Figure 1:
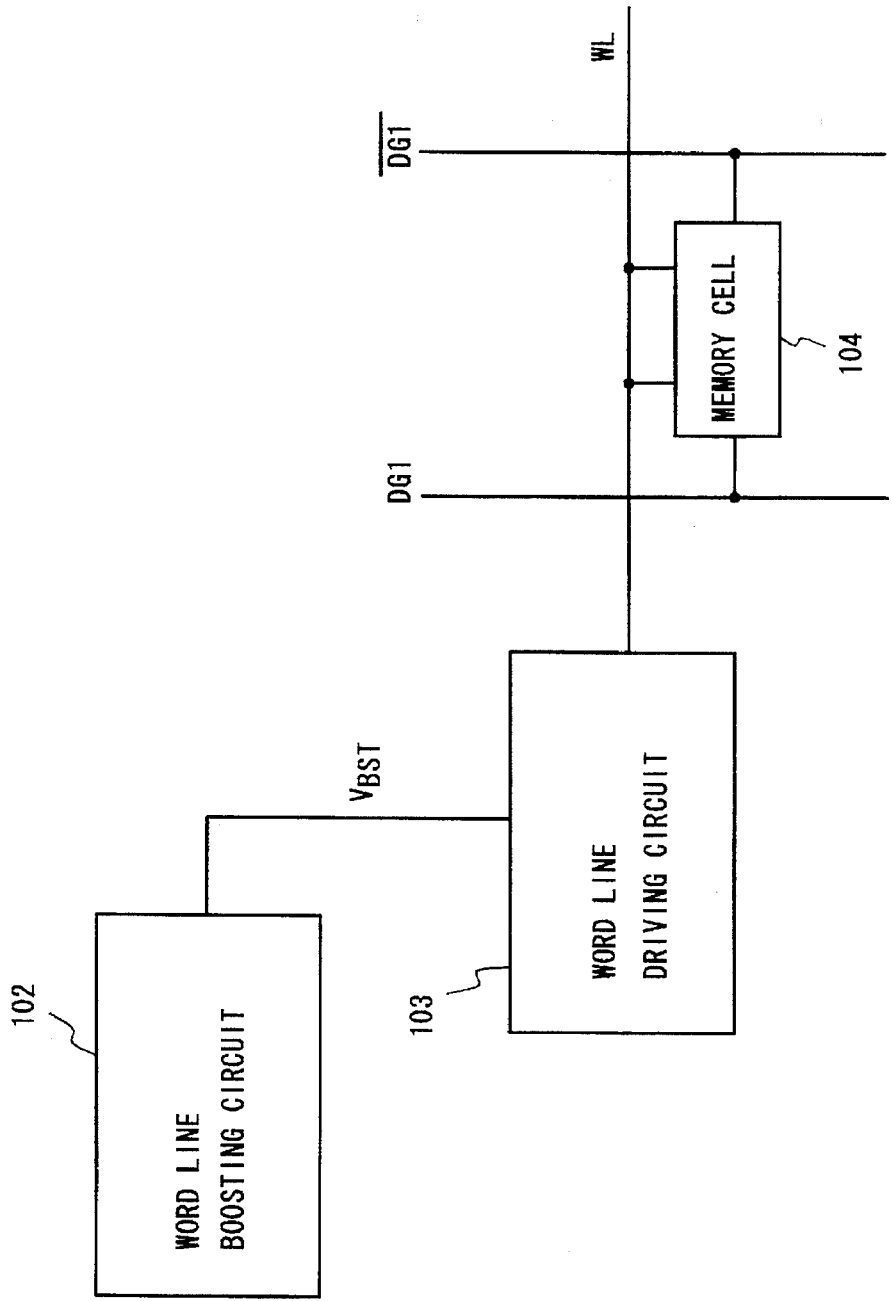
FIG. 1 is a block diagram of the structure of a conventional static type of semiconductor memory device.
Figure 2:
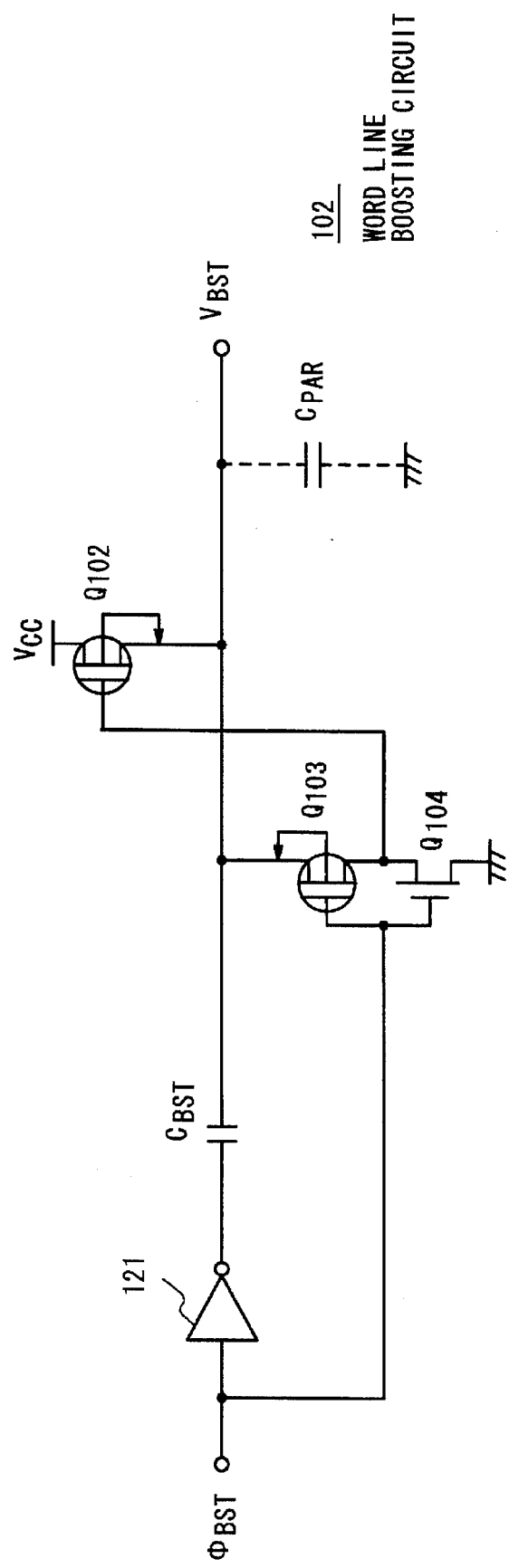
FIG. 2 is a circuit diagram of a word line boosting circuit of FIG. 1.
Figure 9:
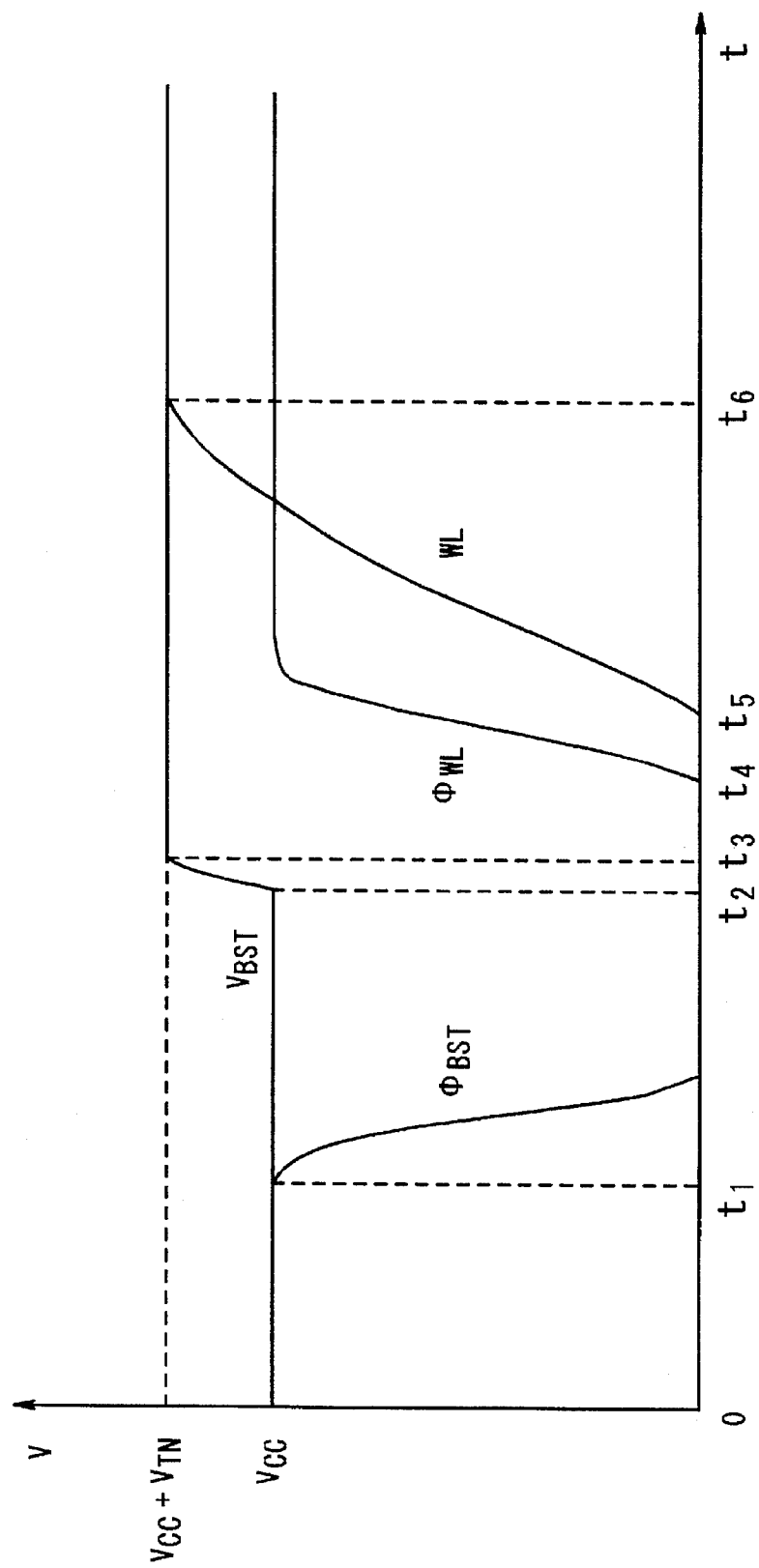
FIG. 9 depicts operation waveform diagrams of the static type of semiconductor memory device according to the first embodiment of the present invention.

The operation of the first embodiment will be described below with reference to FIG. 9, wherein the word line boosting circuit 2, word line driving circuit 3 and memory cell circuit are the same as those shown in FIGS. 2, 3 and 4. FIG. 9 is operation waveforms of the first embodiment of the present invention. Referring to FIG. 9, first, at the time 0, when the signal $\phi_{BST}$ is in the $V_{CC}$ level, the P-channel MOS transistor Q103 of FIG. 2 is in the off state, and the P-channel MOS transistor Q102 and the N-channel MOS transistor Q104 are in the on state. Also, the output of the inverter 121 is in the GND level. Accordingly, the boost up capacitor $C_{BST}$ is charged to the $V_{CC}$ level.

Next, at the time t1, the signal $\phi_{BST}$ starts to be inverted from the $V_{CC}$ level to the GND level. In response to the signal $\phi_{BST}$, the P-channel MOS transistor Q103 gradually changes to the on state and the P-channel MOS transistor Q102 and the N-channel MOS transistor Q104 gradually changes to the off state. At the same time, the output of the inverter 121 starts to rise from the GND level toward the $V_{CC}$ level. That is, the boost up capacitor $C_{BST}$ is arisen from the $V_{CC}$ level. Accordingly, the boosting up effect appears at the time t2 and the boosting up operation is performed until the boosted voltage $V_{BST}$ reaches the voltage of $(V_{CC}+V\alpha)$ at the time t3. At that time, the boosted voltage $V_{BST}$ is suppressed to be approximately equal to voltage of $(V_{CC}+V_{TN})$ by the N-channel MOS transistor Q1 of FIG. 7.

Figure 3:
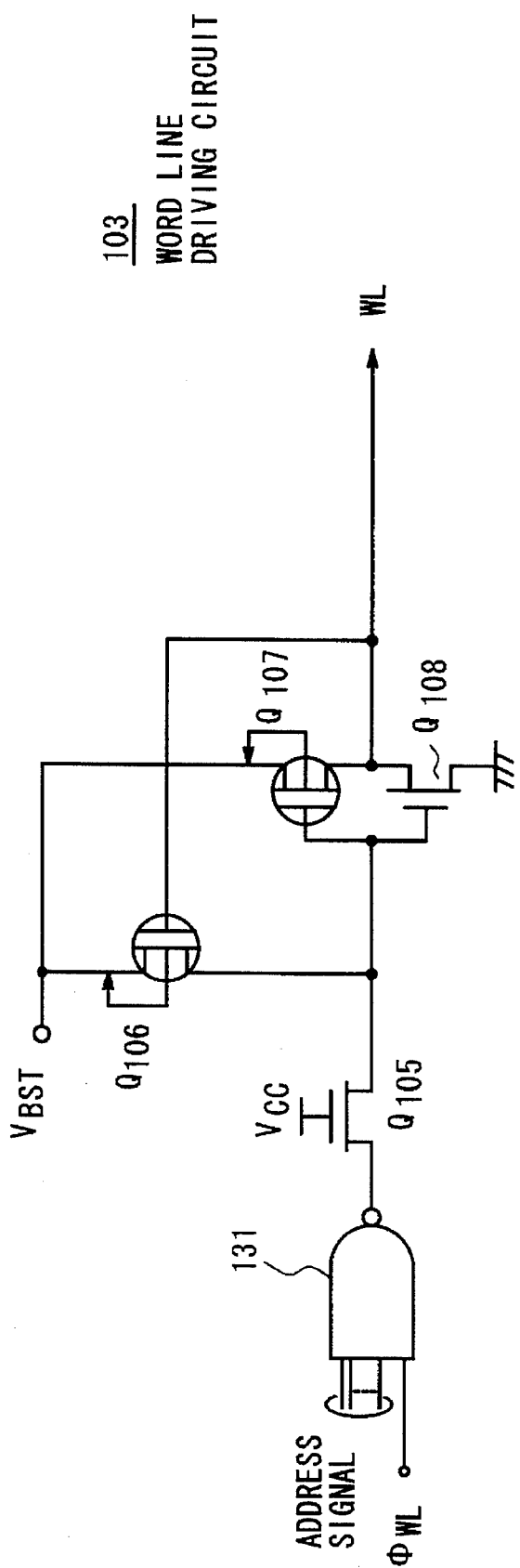
FIG. 3 is a circuit diagram of a word line driving circuit of FIG. 5.
Figure 4:
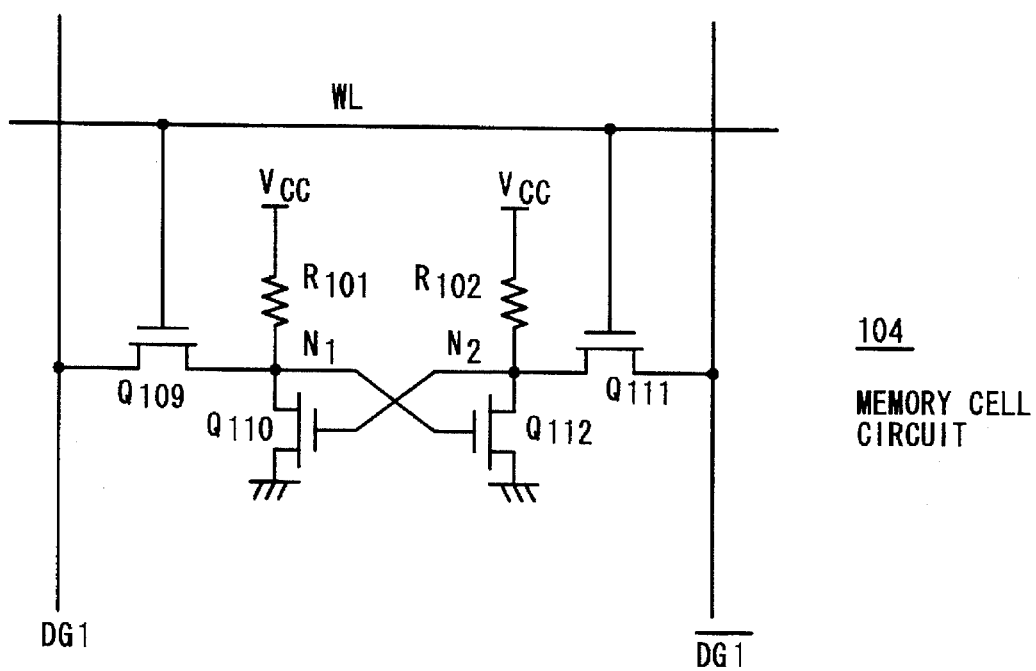
FIG. 4 is a circuit diagram of a memory cell circuit of FIG. 5.
Figure 5:
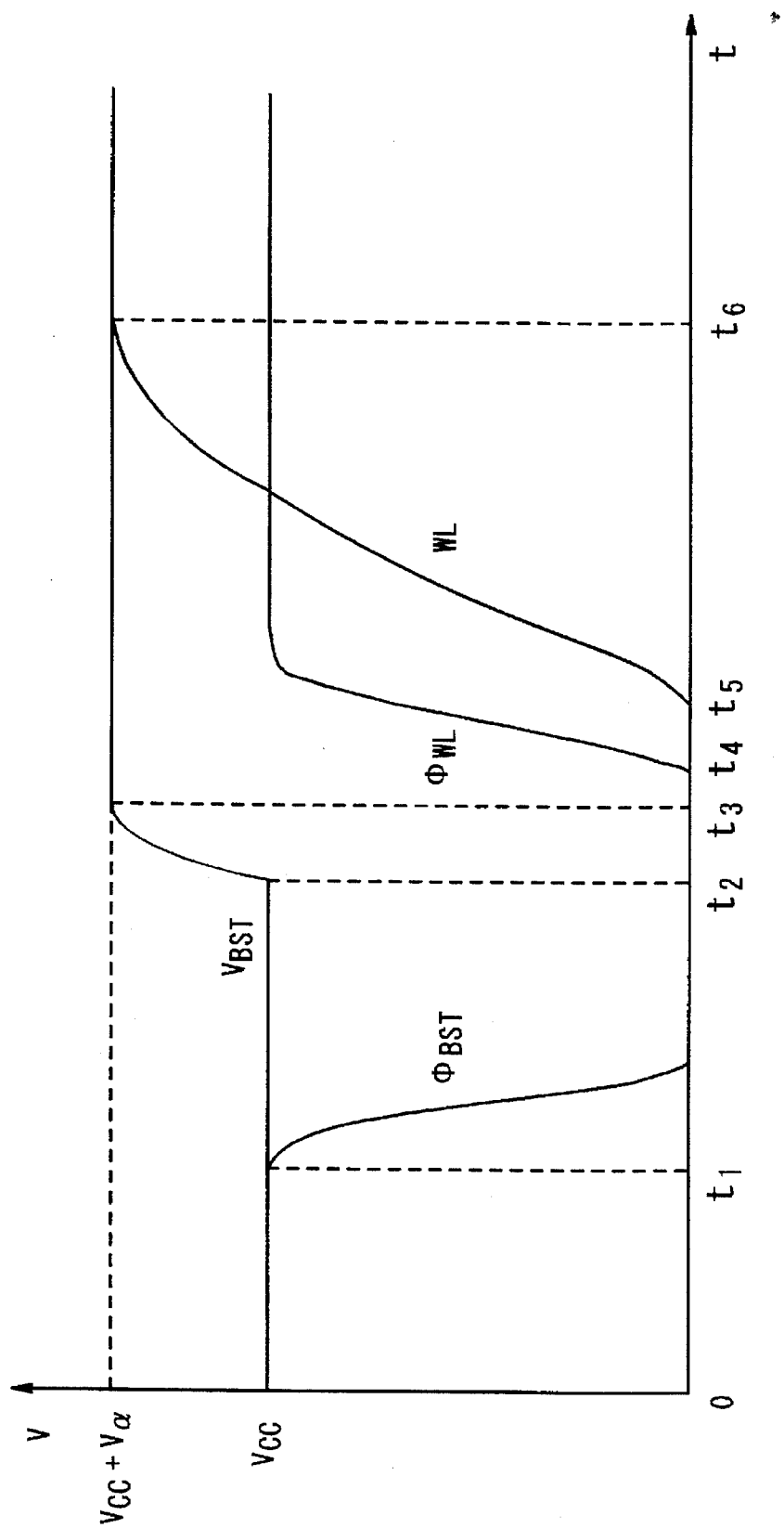
FIG. 5 depicts operation waveform diagrams of the conventional static type of semiconductor memory device of FIG. 1.
Figure 6:
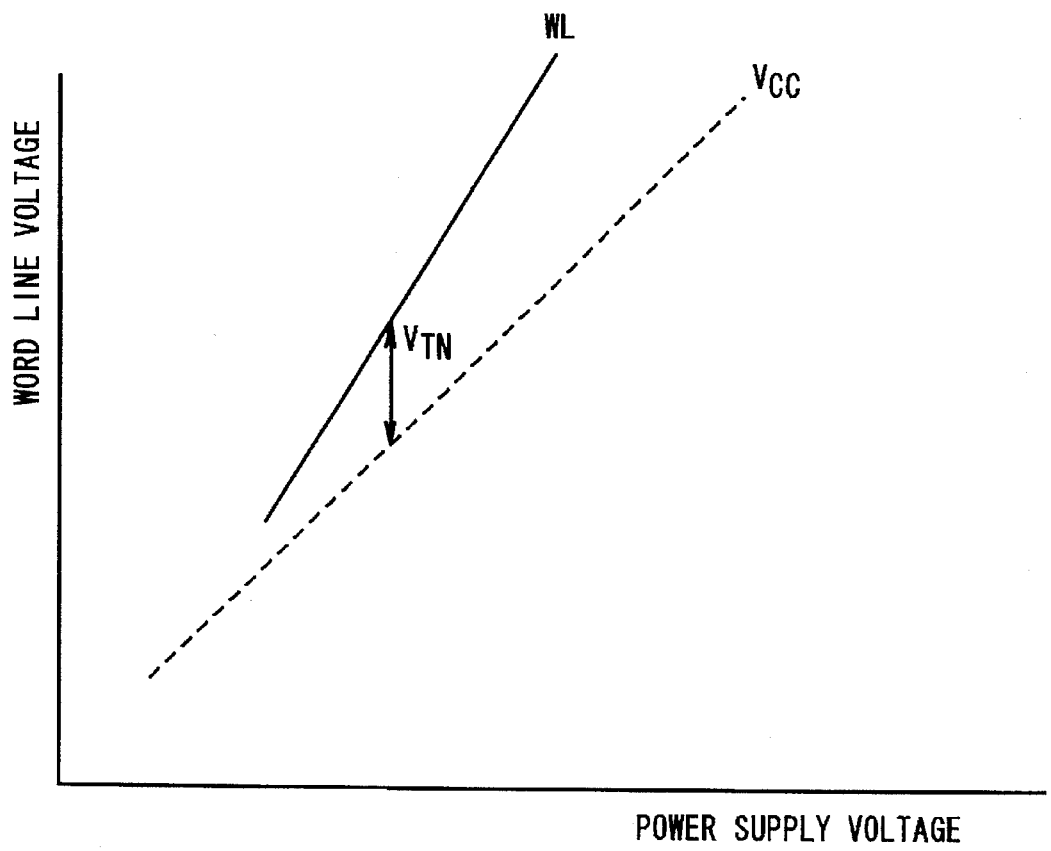
FIG. 6 is a graph showing a relation of the word line voltage and the power supply voltage in the conventional semiconductor memory device of FIG. 1.

Next, at the time t4, the word line activation signal $\phi_{W1}$ rises from the GND level to the $V_{CC}$ level so that the P-channel MOS transistor Q107 of FIG. 3 goes to the on state and the P-channel MOS transistor Q106 and N-channel MOS transistor Q108 goes to the off state. The voltage of the word line WL rises from the time t5 and reaches the voltage of $(V_{CC}+V_{TN})$ at the time t6.

Figure 10:
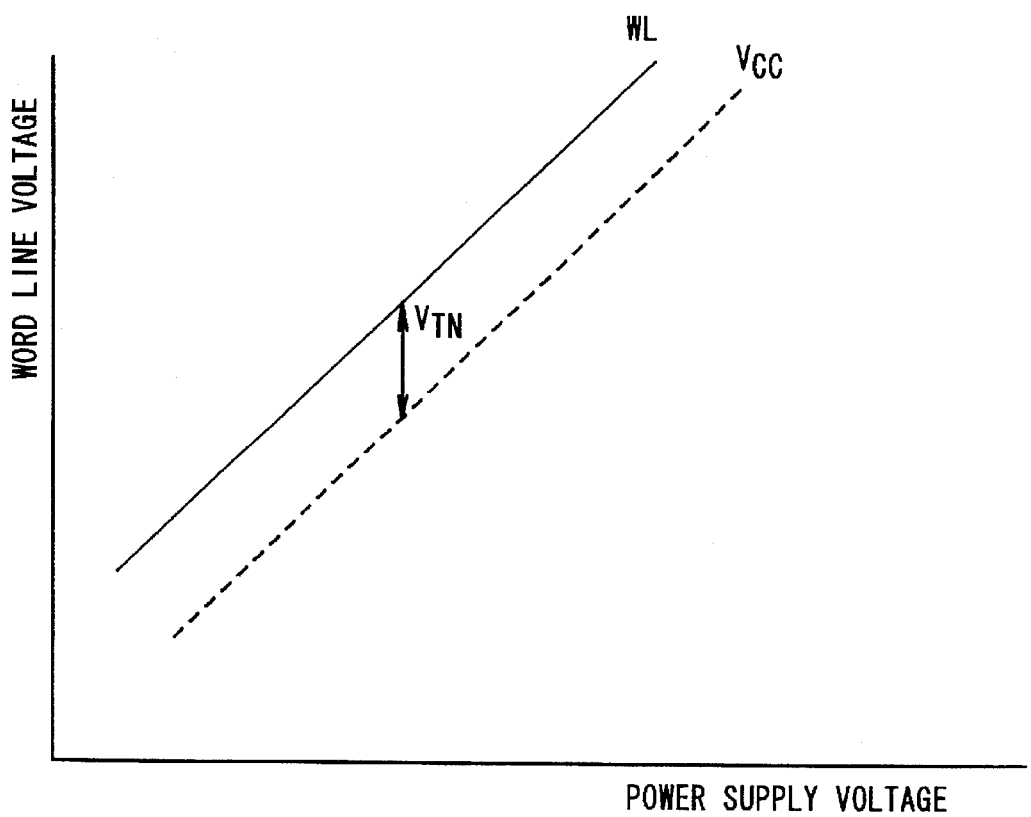
FIG. 10 is a graph showing a relation of the word line voltage and the power supply voltage in the semiconductor memory device according to the first embodiment of the present invention.

FIG. 10 is a diagram showing a relation between the word line voltage and the power supply voltage in the fist embodiment of the present invention. The figure shows that the voltage of the word line WL is adjusted to be in the vicinity of the voltage of $(V_{CC}+V_{TN})$ over the wide range of power supply voltage because the boosted voltage $V_{BST}$ is suppressed to be approximately equal to the voltage of $(V_{CC}+V_{TN})$ by the N-channel MOS transistor Q1.

Figure 11:
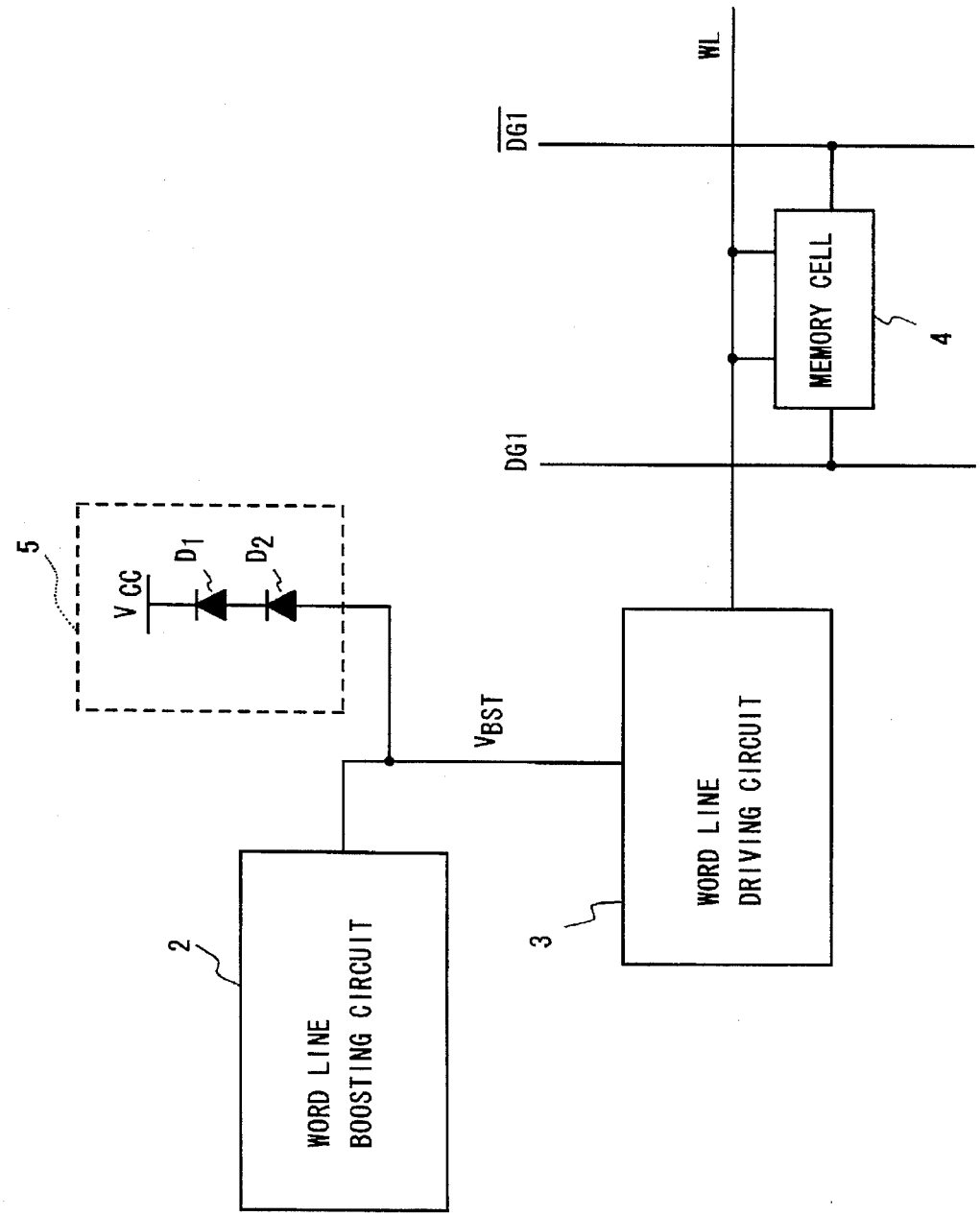
FIG. 11 is a block diagram of a static type of semiconductor memory device according to another embodiment of the present invention.

FIG. 11 is a block diagram of the static type of semiconductor memory device according to another embodiment of the present invention. In the figure, the static type of semiconductor memory device has the same structure as that of the first embodiment of the present invention shown in FIG. 7 except for a suppression circuit 5 provided between the power supply voltage $V_{CC}$ and the boosted voltage $V_{BST}$. In the suppression circuit 5, diodes D1 and D2 are used in place of the N-channel MOS transistor Q1 in the suppression circuit 1. The same components are assigned with the same reference numerals or symbols. Also, the components operate in the same manner as the components having the same reference numerals or symbols in the static type of semiconductor memory device according to the first embodiment of the present invention.

If the forward direction voltage $V_f$ of the diodes D1 and D2 in the suppression circuit 5 has the relation of $V_{TN}+2 V_f$, the voltage of the word line WL can be set to the voltage of about $(V_{CC}+V_{TN})$. Alternatively, the same effect can be obtained even if the a zener diode is used in place of the diodes D1 and D2.

In this manner, in the static type of semiconductor memory device having the word line boosting circuit 2 for the voltage of the word line WL higher than the power supply voltage $V_{CC}$, the boosted voltage $V_{BST}$ of word line WL can be regulated to be in the vicinity of the voltage of $(V_{CC}+V_{TN})$ by connecting the N-channel MOS transistor Q1 or the diodes D1 and D2 to suppress the word line WL voltage to the voltage close to $(V_{CC}+V_{TN})$, i.e., the voltage obtained by adding the threshold voltage $V_{TN}$ of the transfer gate Q109 or Q111 in the memory cell to the power supply voltage $V_{CC}$. As a result, the low voltage operation margin can be increased.

In the embodiments of the present invention, the N-channel MOS transistor Q1 or diodes D1 and D2 are used as means for suppressing the boosted voltage of the word line WL to be in the vicinity of the voltage of $(V_{CC}+V_{TN})$. However, the present invention is not limited to these elements. Alternatively, other means such as a zener diode may be used.

What is claimed is:

1. A static type of semiconductor memory device comprising:

a power supply line for supplying a power supply voltage;

a static type of memory cell having a flip-flop which is composed of two load resistors and two driving MOS transistors respectively connected to said two load resistors, wherein said two load resistors are connected to said power supply line, transfer MOS transistors are provided between output terminals of said flip-flop and said bit lines, respectively, and gates of said transfer MOS transistors are connected to a word line;

a boosting circuit for boosting said power supply voltage;

a word line driving circuit for driving said word line with a boosted voltage supplied from said boosting circuit; and a voltage control circuit for controlling said boosted voltage to be in the neighborhood of a predetermined voltage such that ratio of current through one of said driving MOS transistors in an on state to current through one of said transfer MOS transistors is set to a desired value.

2. A static type of semiconductor memory device comprising:

a power supply line for supplying a power supply voltage;

a static type of memory cell having a flip-flop which is composed of two load resistors and two driving MOS transistors respectively connected to said two load resistors, wherein said two load resistors are connected to said power supply line, transfer MOS transistors are provided between output terminals of said flip-flop and bit lines of a pair, respectively, and gates of said transfer MOS transistors are connected to a word line; and voltage adjusting means for adjusting a voltage of said word line to a predetermined voltage such that a ratio of current flowing through one of said two driving MOS transistors in an on state to current flowing through one of said transfer MOS transistors is set to a desired value.

3. A static type of semiconductor memory device according to claim 2, wherein said voltage adjusting means includes:

a boosting circuit for boosting up said power supply voltage;

a word line driving circuit for driving said word line with said boosted voltage supplied from said boosting circuit; and a voltage control circuit for controlling said boosted voltage to be in the neighborhood of said predetermined voltage.

4. A method of providing a large low voltage operation margin in a static type of semiconductor memory device, comprising the steps of:

providing in said static type of memory cell a flip-flop which is composed of two load resistors and two driving MOS transistors respectively connected to said two load resistors, wherein said two load resistors are connected to a power supply line for supplying a power supply voltage, transfer MOS transistors are provided between output terminals of said flip-flop and bit lines of a pair, respectively, and gates of said transfer MOS transistors are connected to a word line; and adjusting a voltage of said word line to a predetermined voltage such that a ratio of current flowing through one of said two driving MOS transistors in an on state to current flowing through one of said transfer MOS transistors is set to a desired value.

5. A static type of semiconductor memory device according to claim 1, wherein said voltage control circuit comprises a clamping circuit.

6. A static type of semiconductor memory device according to claim 2, wherein said predetermined voltage is approximately equal to a sum of said power supply voltage and a threshold voltage of one of said MOS transistors.

7. A static type of semiconductor memory device according to claim 3, wherein said voltage control circuit is provided between said boosting circuit and said power supply line.

8. A static type of semiconductor memory device according to claim 7, wherein said predetermined voltage is approximately equal to a sum of said power supply voltage and a threshold voltage of one of said MOS transistors.

9. A static type of semiconductor memory device according to claim 8, wherein said voltage control circuit comprises an N-channel MOS transistor having a gate and drain connected to said boosting circuit and a source connected to said power supply line.

10. A static type of semiconductor memory device according to claim 8, wherein said voltage control circuit comprises diodes connected in series, an anode of the first diode being connected to said boosting circuit and a cathode of the last diode being connected to said power supply line.

11. A method of providing a great low voltage operation margin in a static type of semiconductor memory device; comprising the steps of:

providing in said static type of memory cell a flip-flop which is composed of two load resistors and two driving MOS transistors respectively connected to said two load resistors, wherein said two load resistors are connected to said power supply line, transfer MOS transistors are provided between output terminals of said flip-flop and said bit lines, respectively, and gates of said transfer MOS transistors are connected to a word line;

boosting the power supply voltage to provide boosted voltage on a boosted voltage line;

adjusting said boosted voltage to generate a predetermined voltage;

supplying the predetermined voltage to the word line; and performing a write operation or read operation to the memory cell via the pair of bit lines when the predetermined voltage is supplied on the word line, wherein the predetermined voltage supplied on the word line is such that ratio of current through one of said driving MOS transistors in an on state to current through one of said transfer MOS transistors is set to a desired value.

12. A method according to claim 4, wherein the predetermined voltage is approximately equal to a sum of the power supply voltage and a threshold voltage of one of said MOS transistors.

13. A method according to claim 4, wherein said adjusting step includes:

boosting the power supply voltage;

regulating the boosted voltage to the predetermined voltage; and applying the regulated voltage to the word line.

14. A method according to claim 13, wherein the predetermined voltage is approximately equal to a sum of the power supply voltage and a threshold voltage of one of said MOS transistors.

15. A method according to claim 13, wherein said regulating step includes flowing current from the boosted voltage line to the power supply line such that a voltage drop is approximately equal to a threshold voltage of an N-channel MOS transistor between the boosted voltage line and the power supply line.

16. A static type of semiconductor memory device comprising:

a power supply line for supplying a power supply voltage;

a pair of bit lines;

a word line;

a static type of memory cell having a flip-flop which is composed of two load resistors and two driving MOS transistors respectively connected to said two load resistors, wherein said two load resistors are connected to said power supply line, transfer MOS transistors are provided between output terminals of said flip-flop and said bit lines, respectively, and gates of said transfer MOS transistors are connected to a word line;

adjusting means for adjusting a voltage of said word line to a predetermined voltage such that a ratio of current flowing through one of said two driving MOS transistors in an on state to current flowing through one of said transfer MOS transistors is set to a desired value; and an access circuit for performing a write operation or read operation to the memory cell via the pair of bit lines in response to supply of the predetermined voltage to the word line.

17. A static type of semiconductor memory device according to claim 16, wherein the predetermined voltage is approximately equal to a sum of the power supply voltage and a threshold voltage of one of said MOS transistors.

18. A static type of semiconductor memory device according to claim 16, wherein said adjusting means includes:

a boosting circuit for boosting the power supply voltage;

a regulating circuit for regulating the boosted voltage to the predetermined voltage; and a word line driving circuit for applying the regulated voltage to the word line.

19. A static type of semiconductor memory device according to claim 18, wherein the predetermined voltage is approximately equal to a sum of the power supply voltage and a threshold voltage of one of said MOS transistors.

20. A static type of semiconductor memory device according to claim 18, wherein said regulating circuit is adapted for flowing current from the boosted voltage line to the power supply line such that a voltage drop is approximately equal to a threshold voltage of an N-channel MOS transistor between the boosted voltage line and the power supply line.

* * * * *